United States Patent [19]
Seppä

[11] Patent Number: 6,066,948
[45] Date of Patent: May 23, 2000

[54] SQUID MAGNETOMETER HAVING RESISTOR-CAPACITOR DAMPING CIRCUITS

[76] Inventor: Heikki Seppä, P.O. Box 13002, Otakaari 7, Fin-02150 Espoo, Finland

[21] Appl. No.: 08/973,169
[22] PCT Filed: Jun. 2, 1995
[86] PCT No.: PCT/FI95/00316
§ 371 Date: Jul. 22, 1998
§ 102(e) Date: Jul. 22, 1998
[87] PCT Pub. No.: WO96/38737
PCT Pub. Date: Dec. 5, 1996
[51] Int. Cl.[7] .......................... G01R 33/035; H01L 39/24
[52] U.S. Cl. .......................... 324/248; 505/846; 327/527
[58] Field of Search .................. 324/244, 248; 505/845, 846, 874; 327/527, 528; 257/31; 341/133

[56] References Cited

U.S. PATENT DOCUMENTS

| | | | |
|---|---|---|---|
| 3,622,881 | 11/1971 | Silver | 324/248 |
| 5,387,864 | 2/1995 | Gershenson et al. | 324/248 |
| 5,406,201 | 4/1995 | Kiryu et al. | 324/248 |
| 5,488,295 | 1/1996 | Seppa | 324/248 |
| 5,656,937 | 8/1997 | Cantor | 324/248 |

FOREIGN PATENT DOCUMENTS 619497  10/1994  European Pat. Off. .

OTHER PUBLICATIONS

IEEE Transactions on Magnetics, vol. 27, No. 2, Mar. 1991, R. Cântor et al., "Design and optimization of DC squids fabricated using a simplified four–level process", pp. 2927–2931. Mar. 1991.

Ilmoniemi R. et al., "Proceedings of the Tenth International Cryogenic Engineering Conference", 1984, Butterworth, (Helsinki), pp. 457–460., 1984.

*Primary Examiner*—Jay Patidar
*Attorney, Agent, or Firm*—Andrus, Sceales, Starke & Sawall

[57] ABSTRACT

A SQUID magnetometer for low noise, stable measurement of magnetic fields. The magnetometer has a SQUID formed of two Josephson junctions connected in parallel in a superconducting ring. An external damping impedance is connected across the Josephson junctions. The damping impedance has a resistive component and a capacitive component. The damping impedance damps Josephson oscillations occurring at frequencies greater than the frequency response range of said magnetometer. An amplifier stage coupled to said Josephson junctions has a biasing impedance for damping the Josephson junctions in the frequency response range of the magnetometer.

8 Claims, 3 Drawing Sheets

SQUID MAGNETOMETER HAVING RESISTOR-CAPACITOR DAMPING CIRCUITS

BACKGROUND OF THE INVENTION

The present invention relates to a SQUID magnetometer.

The SQUID detector or SQUID (Superconducting QUantum Interference Device) is used for the measurement of weak magnetic fields. The SQUID has an output impedance of only about 1–5 W. Its operating temperature is typically 4.2 K, to which temperature it is cooled by suitable means. The operating temperature depends on the superconducting material used in the SQUID, therefore the operating temperature is as low as required for the operation of the superconductor. The noise at the output is very low; it is hardly higher than the thermal noise in the resistors used for the damping of the Josephson junctions. SQUID detectors are often used to measure low-frequency signals in the range of 0.1 Hz–10 kHz.

The problem with the type of detectors described above is that it is difficult to amplify the output signal without increasing the noise. The reason for this is that the range of voltage variation in the output signal is relatively narrow, about 10 $\mu$V–100 $\mu$V peak to peak. Moreover, the noise at the output of the SQUID roughly corresponds to the thermal noise of the resistors used for the damping of the Josephson junctions. If the noise temperature of an amplifier connected after a SQUID at 4.2 K temperature is below 10 K, the amplifier does not significantly increase the uncertainty of magnetic flux measurement.

No ordinary dc-connected amplifier operating at room temperature has sufficiently low output noise when connected directly to a SQUID. This is due to the low output impedance of the SQUID and to the fact that it is often used to measure low-frequency signals in the range of 0.1 Hz–10 kHz. As FET amplifiers have a very low noise temperature in a frequency range of 1 kHz–100 kHz, flux modulation and a cryogenic transformer are used in connection with a dc SQUID detector to match the low impedance of the SQUID with the FET amplifier. With this arrangement, the uncertainty of the magnetic flux measurement is chiefly determined by the noise of the SQUID. Moreover, it can be proved both theoretically and experimentally that, as the SQUID noise is reduced, the magnetic flux-voltage conversion also increases so that the requirements regarding the signal processing electronics are not heightened.

However, problems ensue when several SQUID detectors are connected together to form multichannel devices. An example of such devices is the multichannel magnetometer. In recent times, these have been produced for the measurement of the weak magnetic fields of the brain and the heart. At present, the aim is to achieve magnetometers with 30–100 channels. If such a multichannel magnetometer is realized using SQUID detectors and the flux modulation technique, the costs of the signal processing electronics will be significant because each SQUID and channel requires a cryogenic transformer, preamplifier, modulator etc. The electronics of a multichannel magnetometer like this will be really complex and expensive.

The output signal of the SQUID can also be amplified by connecting the signal back to the SQUID's input via an extra coil and a resistor connected in series with it. The additional circuit thus formed causes positive feedback if the SQUID is current-biased.

Positive feedback amplifies the output signal, but it can also render the system instable. Instability can be controlled by replacing the resistor e.g. with a field-effect transistor, by means of which the resistance value can be easily adjusted.

If the SQUID is voltage-biased, an additional circuit can be used to cancel the noise in the output voltage of an operational amplifier. In this case, too, the electronics can be advantageously implemented using a variable resistor for the control of noise cancellation. The methods described above are reasonably simple, but generally they are not quite sufficient to reach the noise level of the SQUID.

Dc SQUID magnetometers are traditionally manufactured from two Josephson junctions with a damping resistor connected across them. If the Josephson junction is not resistively damped, it will have a hysteretic characteristic. Correspondingly, a dc SQUID composed of undamped junctions is hysteretic and cannot be used as a magnetometer. If the damping is insufficient, the dc SQUID will work but its noise may remain high. The thermal noise of the damping resistors limits the resolution of a dc SQUID, which is why the aim is to use a damping level as low as possible, yet so that the system remains stable. In practice, the junctions are often over-damped to ensure that the resonances associated with the dc SQUID connection circuits will not produce instability and increase the noise.

SUMMARY OF THE INVENTION

The object of the invention is to eliminate the drawacks described above or at least to reduce them significantly.

A special object of the invention is to present a SQUID magnetometer which is based on non-damped Josephson junctions and which can be damped so that the whole system becomes stable without separate damping of the junctions.

According to the invention, the properties of the SQUID can be so adjusted that it will have a higher gain than currently used SQUIDs and, most importantly, the effective flux noise can be reduced. Another essential feature is that implementing the damping as provided by the invention also makes it possible to consider the effect of the biasing and the preamplifier in the planning of the damping. For the dynamics of the SQUID, this means that the preamplifier will be a part of the SQUID detector and vice versa. Moreover, the method of the invention ensures that the connection circuits of the SQUID will have no effect on its dynamics. Therefore, the effect of the connection circuits need not be considered in the damping of the SQUID itself. This again means that less damping is required and reduces the noise of the SQUID.

The invention and the SQUID detectors constructed in accordance with it, the un SQUID and the hg SQUID, are based on the inventive idea that they are composed of non-damped Josephson junctions. Thus, the present invention relates to two new types of SQUID. The two types of SQUID are hereinafter described as the "un SQUID" (unshunted) and the "hg SQUID" (high gain).

In an embodiment of the invention, the traditional damping resistor is replaced with a series connection of a resistor and a capacitor. The value of the resistor R is of the same order of magnitude as in the case where no capacitor is used. Due to the presence of the capacitor, the junction is normally damped by the resistor R at high frequencies—the frequencies at which Josephson oscillations occur (1 GHz–100 GHz). At low frequencies, the RC circuit provides no resistive damping. No damping is required across the coil between the junctions at low frequencies, either, if the other circuits connected to the SQUID are otherwise well damped. If no additional resistor is connected in parallel with the junctions, the characteristic curves of the SQUID are changed so that the dynamic resistance at the detector output is negative. Consequently, when current-biased, the SQUID is unstable and it cannot be used in the normal way as a magnetometer.

However, if the SQUID is voltage-biased and its current output is read, the SQUID forms a stable device and its output current is proportional to the flux penetrated by the SQUID ring. By supplying a current into a small resistor (e.g. 0.1 Ohm) and connecting the resistor output through the input of a traditional dc SQUID to the SQUID being examined, an arrangement is achieved where, on the one hand, the SQUID being examined is voltage-biased and, on the other hand, its output current can be detected using a traditional SQUID.

Since in this solution the junctions are not damped at low frequencies but the damping required by the system is produced at low frequencies in the biasing circuit, the effect of thermal noise on the effective flux noise is very small. However, the high-frequency thermal noise is mixed down due to the non-linearity and high-frequency oscillation of the Josephson junctions, so at high temperatures (4.2 K) the noise is probably still determined by the thermal noise and not by the quantum noise.

As the SQUID itself in this arrangement of the invention has no damping at low frequencies, the device is called an unshunted SQUID (un SQUID).

In another embodiment of the invention, an additional resistor is connected transversely in parallel with the SQUID junctions. If the resistance value is of the order of R/2, the response of the SQUID resembles the traditional dc SQUID and the dynamic resistance of its output is always positive. If the resistance value is of the order of 2R, the characteristic curves of the SQUID are more like those of a transistor, i.e. the output current is almost independent of the voltage across the component. The current is only proportional to the flux threading the SQUID ring.

Since the dynamic resistance of the output for a certain bias voltage is almost infinite, the voltage noise of the preamplifier at room temperature does not increase the effective flux noise of the SQUID. In other words, the SQUID has a high gain, and the next amplifier stage does not increase the noise of the detector.

As the characteristic curves are of a parabolic form, tine SQUID has to be voltage-biased to avoid oscillation. Operational amplifiers are basically voltage amplifiers, so a voltage bias obtained from them will not necessarily lead to a stable solution when connected to a component having a negative dynamic resistance.

However, if voltage biasing from an operational amplifier is effected by connecting the output of the operational amplifier via a resistance to the output of the SQUID and adjusting the voltage of the SQUID by applying a voltage to a terminal of the operational amplifier, the circuit can be stabilized by adding flux feedback.

In other words, the SQUID together with negative feedback of an operational amplifier forms an unstable device because of the dynamic resistance of the detector, but together with negative flux feedback the whole system is stable. Since the dynamic resistance of the detector output is very large (absolute value) with respect to the operational amplifier, its voltage noise does not increase the effective noise of the SQUID. Only the current noise of the operational amplifier has an effect, but typically its significance is smaller than the effect of the internal flux noise of the SQUID.

As the arrangement of the invention leads to a SQUID in which the noise of the operational amplifier (voltage noise) does not increase the noise of the detector, we call such a SQUID a high-gain SQUID (hg SQUID); the detector behaves just as if it had a very high gain.

In both SQUIDs of the invention, the hg SQUID and the un SQUID, the importance of the damping of the flux transmission coils coupled with the SQUID is emphasized. In traditional SQUIDs as well, input circuits with insufficient damping increase the noise of the SQUID.

BRIEF DESCRIPTION OF THE SEVERAL VIEWS OF THE DRAWING

In the following, the invention is described in detail by referring to the attached drawings, in which.

DETAILED DESCRIPTION OF THE INVENTION

Figure 1:
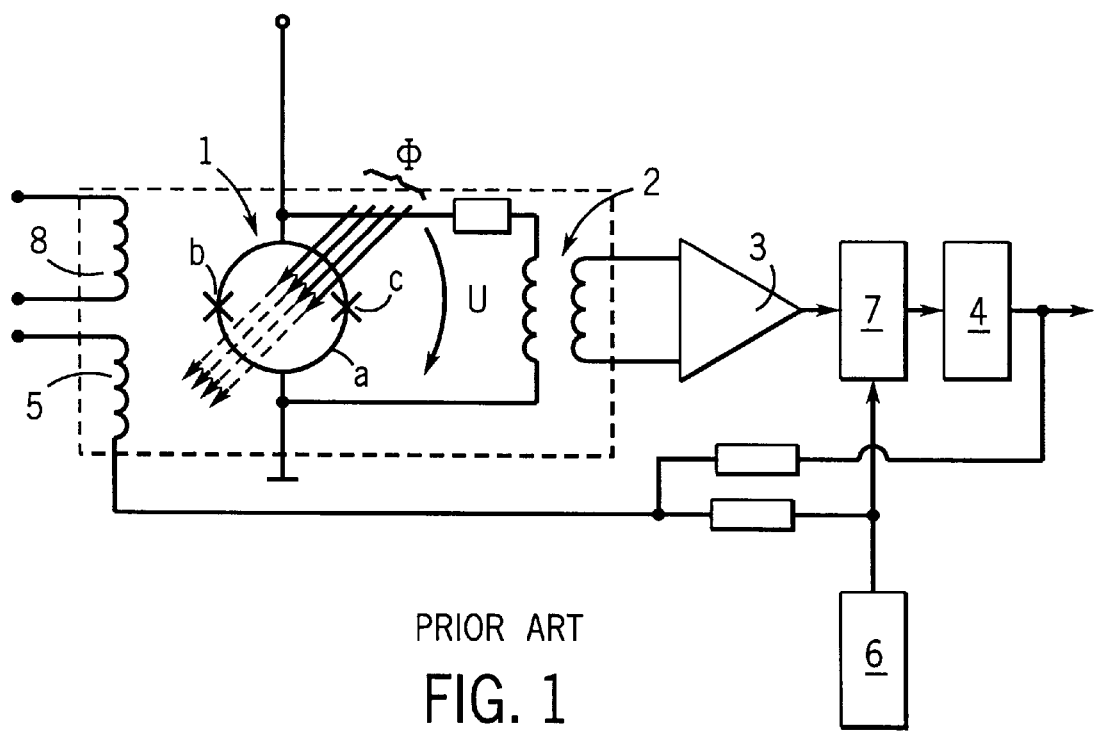
FIG. 1 presents a diagram representing a SQUID detector and output signal processing as known in the art.

FIG. 1 presents in diagrammatic form a SQUID detector 1 and a conventional output signal processing apparatus. The apparatus comprises a transformer 2, which matches the detector with a FET preamplifier 3. The output of the preamplifier is connected through a demodulator 7 and a regulator 4 to a flux modulation winding 5, to which is also connected a modulator 6. The output signal of the processing apparatus is obtained from the output of the regulator 4. The apparatus also shows a signal winding 8 used to transfer the current or magnetic field to be measured to the ring a of the SQUID 1.

Figure 2:
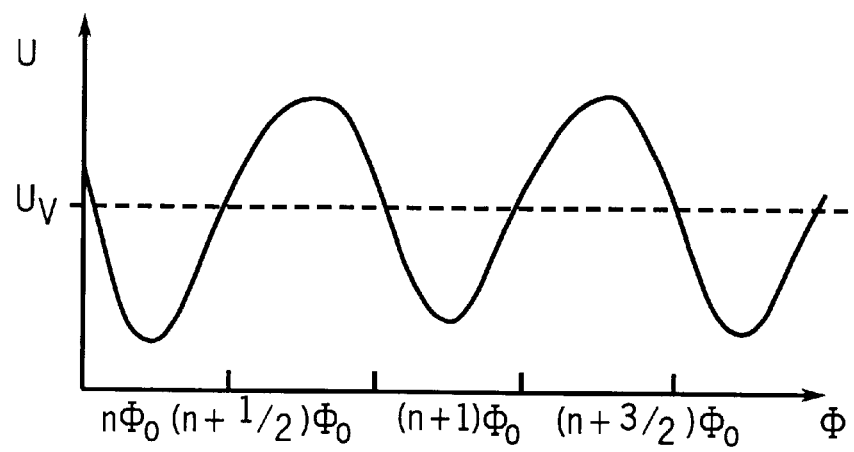
FIG. 2 illustrates the dependence of the output voltage of the SQUID on the incident magnetic flux in an arrangement as illustrated by FIG. 1.

The SQUID 1 consists of a superconducting ring a and one or two Josephson junctions held at a low temperature, e.g. 4.2 K. The transformer 2 and windings 5 and 8 (i.e. the components encircled with a borken line) are also held at the same temperature. In this case, the ring a comprises two Josephson junctions b, c. Such a detector is called a dc SQUID. The detector converts the flux F of the magnetic field threading the superconducting ring into a voltage U. Typically, the SQUID output voltage U as a function of flux F is of a cyclic form as shown in FIG. 2, and it contains a constant portion U, depending on the critical current of the Josephson junctions. The cycle time is one flux quantum $F_o=2.05 \cdot 10^{-15}$ Wb.

The SQUID detector is used together with a modulator 6 or a so-called flux modulator and a cryogenic transformer 2 to match the low impedance of the SQUID with the FET preamplifier. Amplifiers based on the field-effect transistor (FET) have a very low noise temperature in the frequency range of about 1 kHz–100 kHz.

In the flux modulator 6, the amplitude of a square wave modulation signal is set to a value corresponding to half the cycle time of the response (see FIG. 2); thus there are two operating points for each cycle F, so that the flux modulation will not cause any voltage variation at the output of the SQUID. However, if the external flux causes a shift of the operating point, the square wave appears across the SQUID and is amplified by the amplifier 3 connected after the transformer 2. The regulator 4 restores the flux back to zero by supplying a correcting current into the winding 5 coupled with the SQUID.

Figure 3:
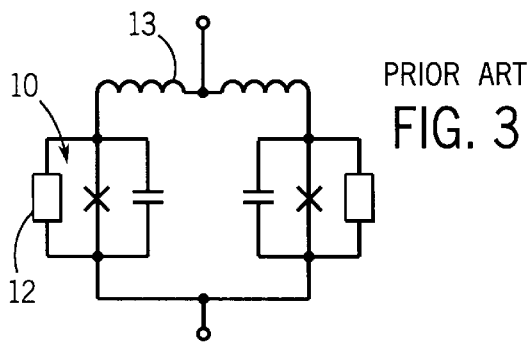
FIG. 3 presents a dc SQUID.

FIG. 3 presents a traditional dc SQUID consisting of a Josephson junction 10, the junction capacitance, resistance 12 connected in parallel with the junction and an inductance 13 connecting the junctions.

Figure 4:
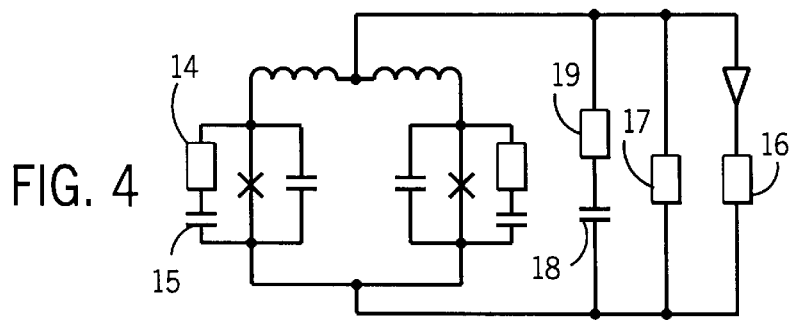
FIG. 4 presents an un or hg SQUID in which the resistance has been replaced with a series connection of a resistance and a capacitance.

FIG. 4 shows an un or hg SQUID in which the resistance 12 has been replaced with a series connection of a resistance 14 and capacitance 15. In the case of an un or hg SQUID, an impedance 16 formed by the biasing circuits and the next amplifier stage appears in parallel with the SQUID. In the case of a hg SQUID, a resistance 17 is connected across the SQUID, which has an influence on the V-I characteristics of the SQUID. If the voltage biasing circuit is slow, it is often necessary to include a series connection of a capacitor 18 and a resistance 19 outside the SQUID. The circuit damps the junctions at frequencies that are too high for the operational amplifier but too low for the damping circuits 14 and 15 integrated in the SQUID circuit.

Figure 5:
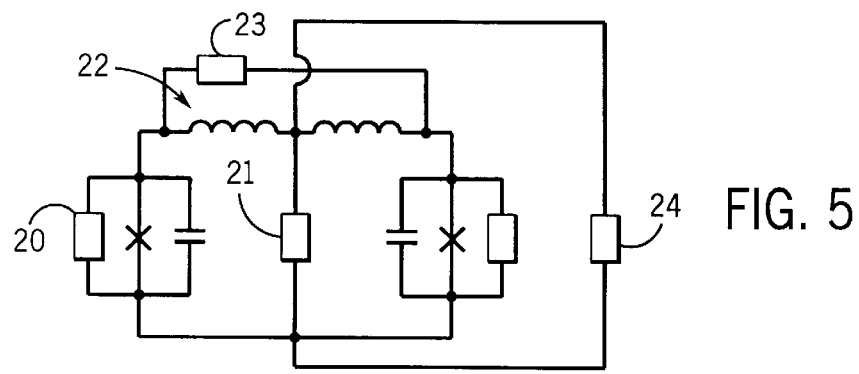
FIG. 5 presents the circuit of an un or hg SQUID in a general case.

FIG. 5 presents the circuit of an un or hg SQUID in a general case. An essential feature of un and hg SQUIDs is that the damping impedance 20 of the junctions are subject to the rule that at low frequencies the real part of the impedance approaches infinity. In other words, the junctions cannot be damped at low frequencies. At high frequencies, the junctions can alternatively be damped by means of impedance 21. It is possible to connect across the coil 22 a separate damping system 23 which mainly consists of the impedance involved in the connection circuits of the SQUID or of separate damping elements placed at this point. The impedance 24 across the SQUID represents the load impedance formed by the biasing circuit, the next amplifier stage or a separate impedance.

Figure 6:
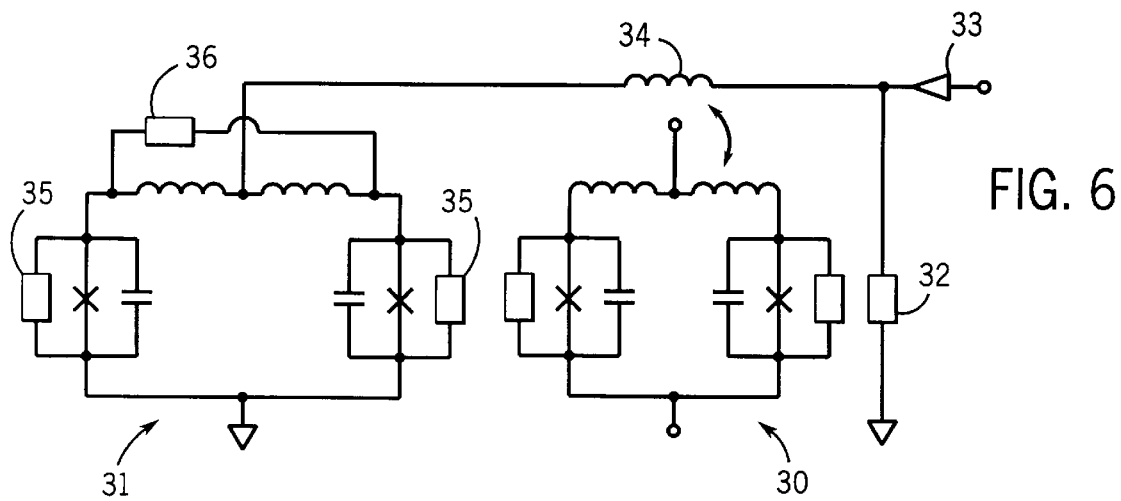
FIG. 6 illustrates the amplification of the output signal of the SQUID.

FIG. 6 illustrates the amplification of the output signal of a SQUID based on undamped Josephson junctions. SQUID 30 measures the output current of un SQUID 31. The current 33 flowing through resistor 32 produces a voltage bias on the un SQUID, applied via the un SQUID input coil 34. The damping of the un SQUID junctions is represented in the figure by impendances 35 and an impedance 36 imposed across the inductances.

Figure 7:
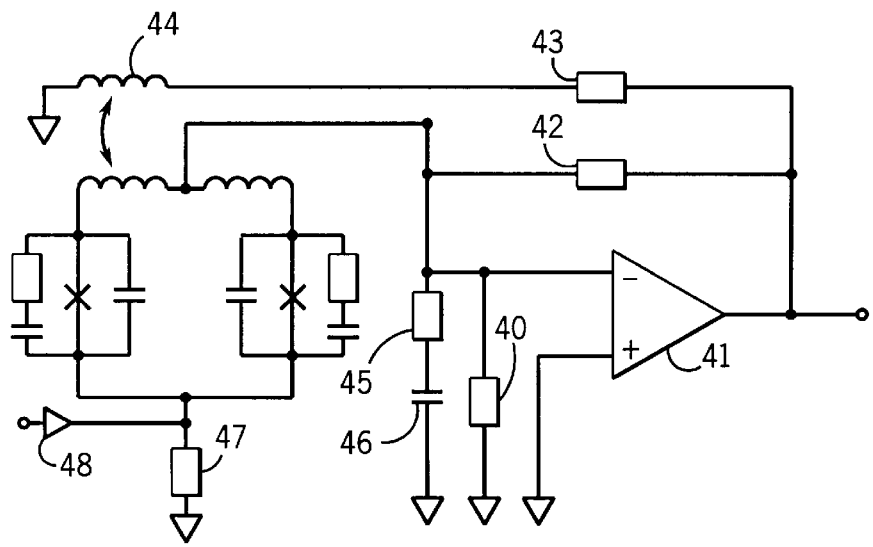
FIG. 7 presents a hg SQUID.

FIG. 7 shows a hg SQUID with a resistor 40 placed across it. The hg SQUID is voltage-biased via operational amplifier 41 and resistor 42. Since the dynamic resistance of the hg SQUID may be negative, the system is only stable if it is provided with negative feedback e.g. by connecting the output of the operational amplifier via a resistor 43 and a coil 44 back to the SQUID. The form of the characteristic is adjusted by means of resistor 40 and the junctions are damped e.g. in the frequency range of 1 MHz–1 GHz by means of resistor 45 and capacitor 46. The SQUID is voltage-biased by means of resistor 47 and current 48.

Figure 8:
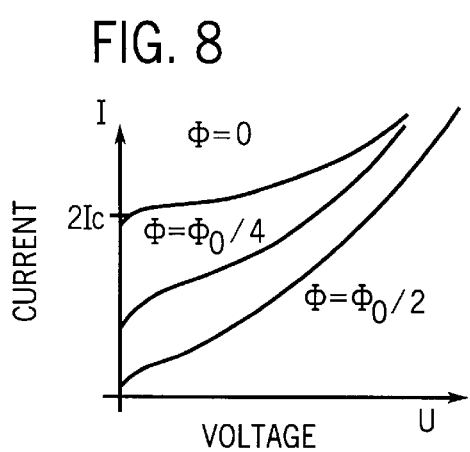
FIG. 8 presents the voltage-current characteristic of a traditional dc SQUID for different magnetic flux values.
Figure 9:
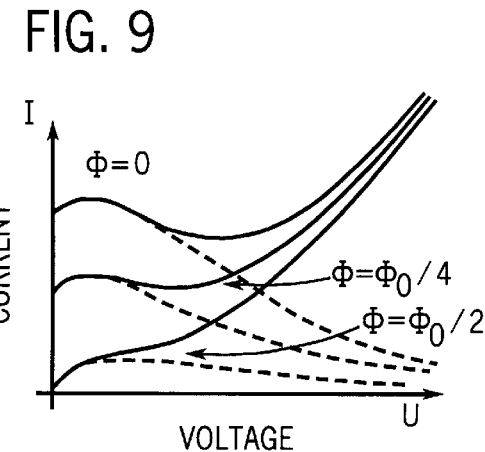
FIG. 9 presents the characteristic curves of a voltage-biased un SQUID and the characteristic curves of a hg SQUID (in broken lines)

FIG. 8 shows the voltage/current characteristics of a traditional dc SQUID for different magnetic flux vales. The current that produces a voltage across the SQUID when the flux is zero is 2Ic, where Ic is the critical current of the Josephson junction. In FIG. 9, the solid lines represent the characteristics of a voltage-biased un SQUID. Voltage-biasing means that a low-impedance source is connected across the SQUID and the current flowing through the source is measured. The characteristics of the hg SQUID are depicted with broken lines. The resistance across the hg SQUID has an effect on the form of the characteristic. Unlike the normal dc SQUID, the un SQUID and hg SQUID have characteristics resembling those of a transistor. Because of its high dynamic output resistance, the hg SQUID has a gain higher than that of an ordinary dc SQUID. The un SQUID has a negative output resistance and, due to the reduced low-frequency damping of the junctions, exhibits less noise than a normal dc SQUID or a hg SQUID.

Figure 10:
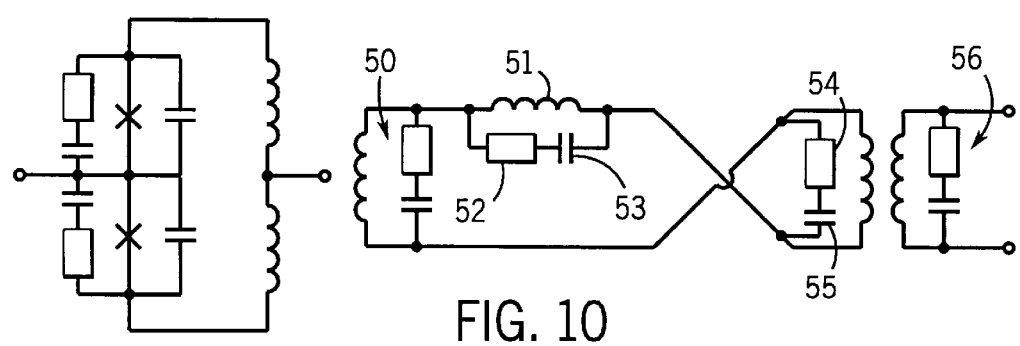
FIG. 10 illustrates the connection of the SQUID to an external antenna via an intermediate transformer.

As illustrated by FIG. 10, the SQUID is often connected to an external antenna via an intermediate transformer. The transformer constitutes a transmission line. The microwave signal flowing in the transmission line may be reflected at impedance discontinuities. Often the transmission line is terminated in an RC circuit 50. Especially when an intermediate transformer with an RC circuit is used, sufficient matching is not achieved. This is because at high frequencies the secondary of the intermediate transformer represents a condition almost equal to a short-circuit. By adding e.g. a oil 51 and in parallel with it a series connection of a resistance 52 and a capacitor 53, the transmission line can be so matched that no reflections arise. In addition, the figure-8-shaped intermediate transformer can be provided a series connection of a resistance 54 and a capacitor 55 and the transformer following the intermediate transformer must be provided with an RC circuit 56.

Achieving a low noise level requires the use of all the components described above, but the invention described here concerns a series circuit which is placed in the antenna structure of the SQUID or in the intermediate transformer and in which the inductance is superconducting and a lossy circuit, e.g. a series connection of a resistor and capacitor, is placed across it. The lossy circuit connected across the coil may also be a more complex one than an RC circuit. The essential point is, however, that at low frequencies the circuit does not produce a noise current in the intermediate transformer or in the antenna inductor, which would increase the noise of the SQUID.

What is claimed is:

1. A SQUID magnetometer for low noise, stable measurement of magnetic fields, said magnetometer having a frequency responsive range and comprising:

a SQUID formed of two Josephson junctions connected in parallel in a superconducting ring;

an external damping impedance connected across the Josephson junctions, said damping impedance having a resistive component and a reactive component, said damping impedance damping Josephson oscillations occurring at frequencies greater than the frequency response range of said magnetometer; and an amplifier stage coupled to said Josephson junctions for amplifying a signal received from said Josephson junctions, said amplifier stage having means for damping the Josephson junctions in the frequency response range of the magnetometer.

2. A SQUID magnetometer as defined in claim 1 wherein said damping impedance comprises a series connected resistor and capacitor connected across each of said Josephson junctions.

3. A SQUID magnetometer as defined in claim 2 further comprising an additional resistor connected in parallel with said Josephson junctions.

4. A SQUID magnetometer as defined in claim 3 wherein the resistance value of said additional resistor is substantially one half the resistance value of said resistor of said damping impedances, thereby to render the response of the SQUID similar to that of a traditional dc SQUID and the dynamic resistance of its output positive.

5. A SQUID magnetometer as defined in claim 3 wherein the resistance value of said additional resistor is substantially twice the resistance value of said resistor of said damping impedances, thereby rendering the characteristic curves of the SQUID parabolic.

6. A SQUID magnetometer as defined in claim 1 wherein said SQUID has an inductance connecting the Josephson junctions and wherein said damping impedance is connected across said inductance.

7. A SQUID magnetometer as defined in claim 1 wherein said damping means comprises a biasing circuit coupled to said amplifier stage.

8. A SQUID magnetometer as defined in claim 1 wherein said damping means comprises a separate impedance in the amplifier stage.

* * * * *